(12) United States Patent
Tang et al.

(10) Patent No.: US 9,159,907 B2
(45) Date of Patent: Oct. 13, 2015

(54) HYBRID FILM FOR PROTECTING MTJ STACKS OF MRAM

(75) Inventors: Bang-Tai Tang, New Taipei (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 853 days.

(21) Appl. No.: 13/198,165

(22) Filed: Aug. 4, 2011

(65) Prior Publication Data

US 2013/0032908 A1    Feb. 7, 2013

(51) Int. Cl.
| H01L 21/00 | (2006.01) |
| H01L 43/08 | (2006.01) |
| H01L 43/12 | (2006.01) |

(52) U.S. Cl.
CPC ............... *H01L 43/08* (2013.01); *H01L 43/12* (2013.01)

(58) Field of Classification Search
CPC ..................... H01L 21/02107; H01L 21/0226; H01L 21/02263; H01L 21/02274; H01L 21/02277; H01L 27/222; H01L 43/08; H01L 43/12
USPC .............. 438/3, 778, 791, 792; 257/295, 298, 257/421, E27.104, E29.164, E29.167, 257/E29.323; 365/145, 158, 171, 173
See application file for complete search history.

(56) References Cited

U.S. PATENT DOCUMENTS

| 5,391,917 | A | 2/1995 | Gilmour et al. |
| 5,510,298 | A | 4/1996 | Redwine |
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 7,696,551 | B2 * | 4/2010 | Xiao et al. ..................... 257/295 |
| 7,723,128 | B2 * | 5/2010 | Wang et al. ................... 257/295 |
| 8,081,505 | B2 * | 12/2011 | Kajiyama et al. ............. 365/158 |
| 2005/0037153 | A1 * | 2/2005 | Schmitt et al. ................ 427/569 |

\* cited by examiner

*Primary Examiner* — Kenneth Parker
*Assistant Examiner* — John Lin
(74) *Attorney, Agent, or Firm* — Slate & Matsil, L.L.P.

(57) ABSTRACT

A method includes patterning a plurality of magnetic tunnel junction (MTJ) layers to form a MTJ stack, and forming a first dielectric cap layer over a top surface and on a sidewall of the MTJ stack. The step of patterning and the step of forming the first dielectric cap layer are in-situ formed in a same vacuum environment. A second dielectric cap layer is formed over and contacting the first dielectric cap layer.

18 Claims, 8 Drawing Sheets

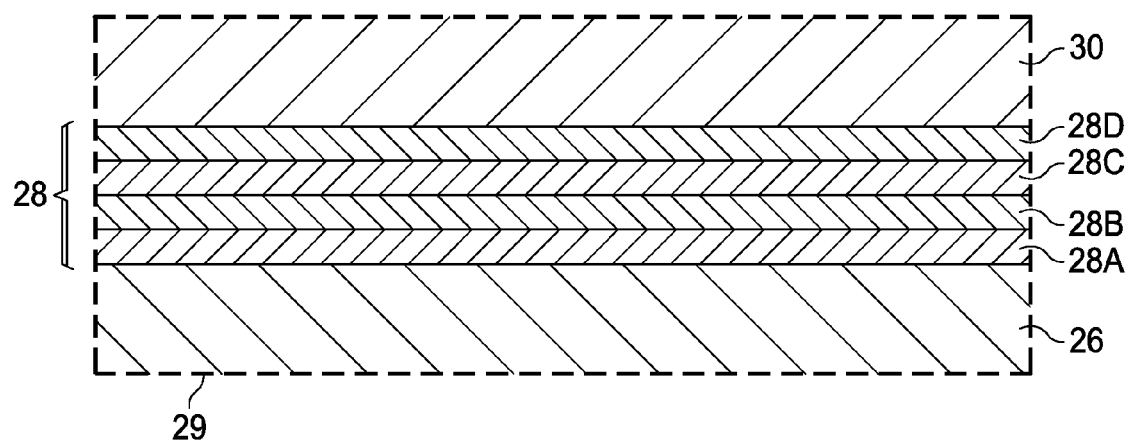
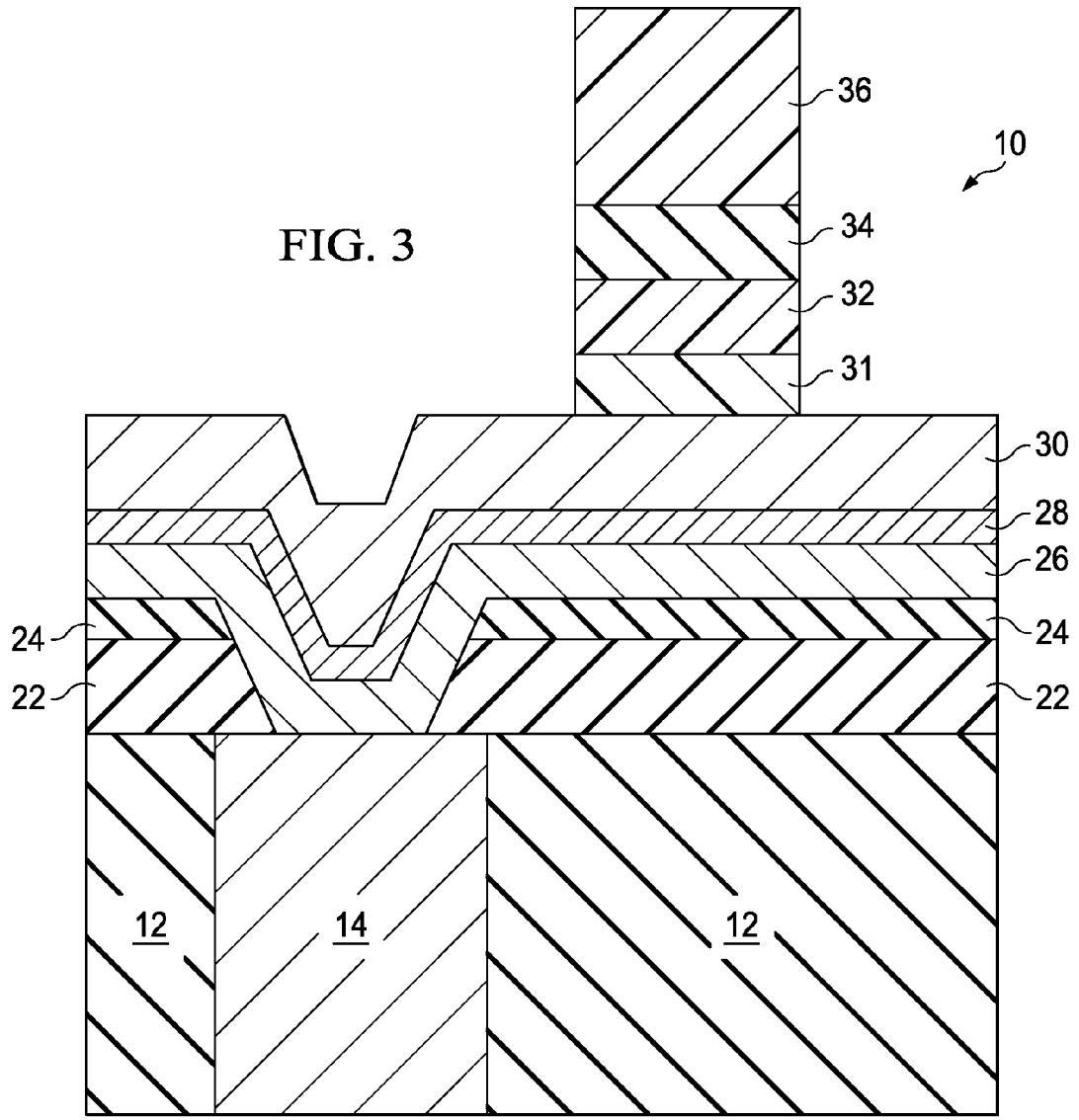

HYBRID FILM FOR PROTECTING MTJ STACKS OF MRAM

BACKGROUND

Semiconductor memories are used in integrated circuits for electronic applications, including radios, televisions, cell phones, and personal computing devices, as examples. One type of semiconductor memory device is magnetoresistive random access memory (MRAM), which involves spin electronics that combines semiconductor technology and magnetic materials and devices. The spins of electrons, through their magnetic moments, rather than the charge of the electrons, are used to indicate bit values.

A typical MRAM cell may include a magnetic tunnel junction (MTJ) stack, which includes a pinning layer, a pinned layer over the pinning layer, a tunnel layer over the pinned layer, and a free layer over the tunnel layer. During the formation of the MRAM cell, a plurality of blanket layers is first formed. The blanket layers are then patterned by a photo etching to form the MTJ stack. A cap dielectric layer is then formed on the sidewalls, and possibly over the top surface, of the MTJ stacks, and the MTJ stack is protected by the cap dielectric layer.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8 are cross-sectional views of intermediate stages in the manufacturing of a magnetoresistive random access memory (MRAM) cell in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A magnetoresistive random access memory (MRAM) cell and the method of forming the same are provided in accordance with various embodiments. The intermediate stages of forming a magnetic tunnel junction (MTJ) stack and the overlying structure are illustrated. The variations of the embodiments are discussed. Throughout the various views and illustrative embodiments, like reference numbers are used to designate like elements.

Figure 1:
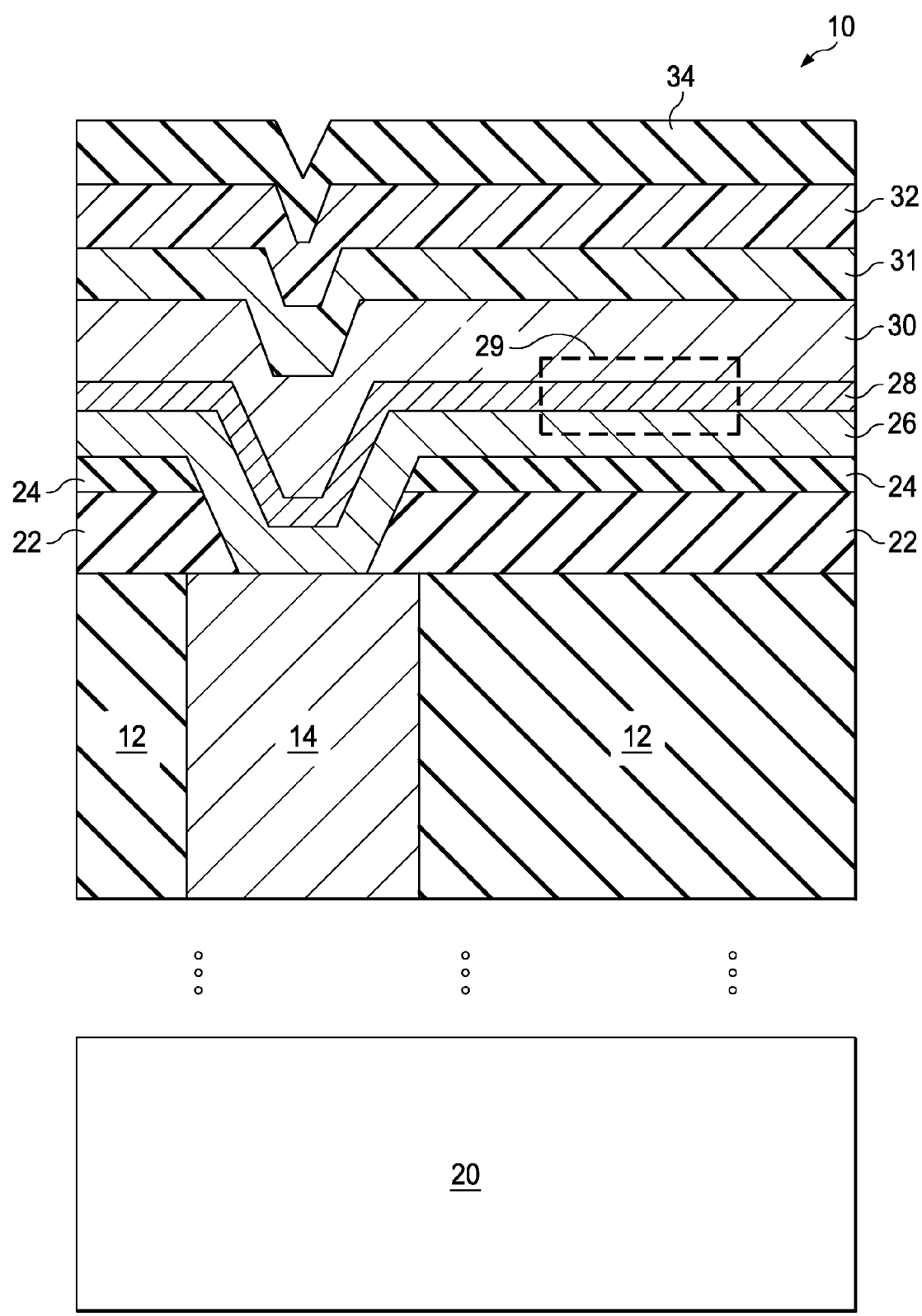

Referring to FIG. 1, wafer 10, which includes substrate 20, is provided. Substrate 20 may be formed of commonly known semiconductor materials, such as silicon, silicon germanium, silicon carbon, or the like. In an embodiment, substrate 20 is a bulk silicon substrate. In FIGS. 3 through 8, substrate 20 is not shown, although substrate 20 is also located under the structures shown in FIGS. 3 through 8. Dielectric layer 12 is formed over substrate 20. In an embodiment, dielectric layer 12 is a low-k dielectric layer having a k value smaller than about 3.0 or lower than about 2.5. Metal feature 14, which may be formed of copper or a copper alloy, is formed in dielectric layer 12. Dielectric layer 22 is formed over dielectric layer 12. In an embodiment, dielectric layer 22 comprises a silicon carbide.

Insulation layer 24, bottom electrode layer 26, and MTJ layers 28 are formed over dielectric layer 22, for example, using chemical vapor deposition (CVD) methods. Insulation layer 24 may be formed of silicon nitride, silicon oxide, silicon oxynitride, or other dielectric materials. Bottom electrode layer 26 is formed of a conductive material, such as a metal or a metal alloy. In an embodiment, bottom electrode layer 26 is formed of tantalum or a tantalum alloy. Bottom electrode layer 26 is electrically coupled to metal feature 14.

MTJ layers 28 may include various layers. FIG. 2 illustrates a magnified view of a portion of the structure shown in FIG. 1, wherein the illustrated portion is retrieved from the region marked as 29 in FIG. 1. In an exemplary embodiment, as shown in FIG. 2, MTJ layers 28 include pinning layer 28A, pinned layer 28B over pinning layer 28A, tunnel barrier layer 28C over pinned layer 28B, and free layer 28D over tunnel barrier layer 28C. The neighboring layers in layers 28A, 28B, 28C, and 28D may also be in physical contact with each other. In addition, MTJ layers 28 may have other variations. In an exemplary embodiment, pinning layer 28A is formed of PtMn, pinned layer 28B is formed of CoFe or CoFeB, tunnel barrier layer 28C is formed of MgO, and free layer 28D is formed of CoFeB. The magnetic moment of free layer 28D may be programmed, and the resistance of the resulting MTJ cell is accordingly changed between a high resistance and a low resistance. It is realized that the materials and the structure of MTJ layers 28 may have many variations, which are also within the scope of the present disclosure. For example, MTJ layer 28 may further include additional layers, such as anti-ferro-magnetic layers (not shown). Layers 28A through 28D may also be formed in an order inversed from what is shown in FIG. 2. Accordingly, free layer 28D may be the bottom layer of layers 28, while pinning layer 28A may be the top layer.

Referring back to FIG. 1, top metal layer 30 is formed over MTJ layers 28. In an embodiment, metal layer 30 is formed of tantalum, a tantalum alloy, or other metallic materials. A plurality of layers is formed over top metal layer, wherein the plurality of layers is used for the patterning of top metal layer 30 and MTJ layers 28. In an embodiment, the plurality of layers includes amorphous carbon (APF) layer 31, mask layer 32 (which may be formed of silicon oxide, for example), and bottom anti-reflective coating (BARC) 34 (which may be formed of silicon oxynitride). In alternative embodiments, the plurality layers may include different combinations of layers.

Referring to FIG. 3, photo resist 36 is formed and patterned in order to define the pattern of an MTJ cell. It is realized that although only one part of the patterned photo resist 36 is illustrated, there may be an array of the patterned photo resist components, which are for forming a MTJ cell array. BARC 34, mask layer 32, and APF layer 31 are then patterned using the patterned photo resist 36 as a mask.

Figure 4:
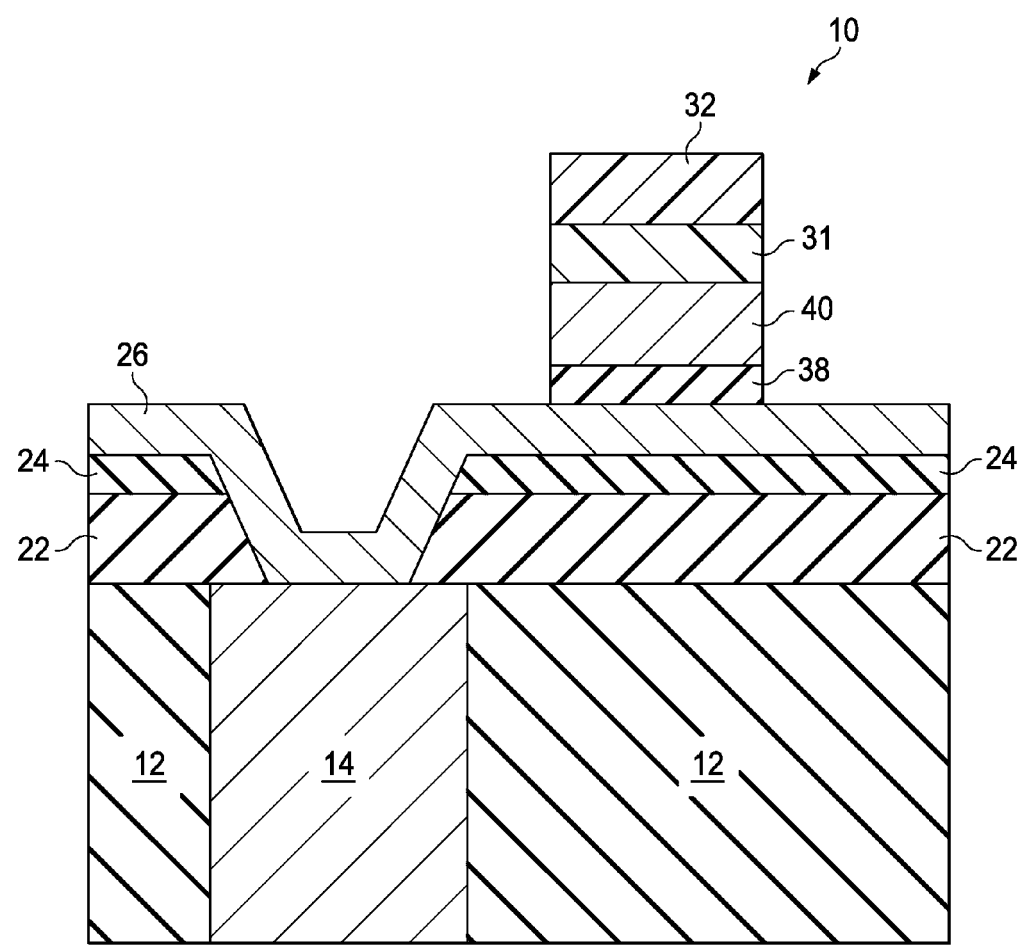

Referring to FIG. 4, Photo resist 36 and BARC 34 are removed, and MTJ layers 28 and metal layer 30 are patterned, and the resulting parts of MTJ layers 28 and metal layer 30 are referred to as MTJ stack 38 and top metal 40, respectively. Next, mask 32 layer is removed, and the resulting structure is shown in FIG. 5.

Figure 5:
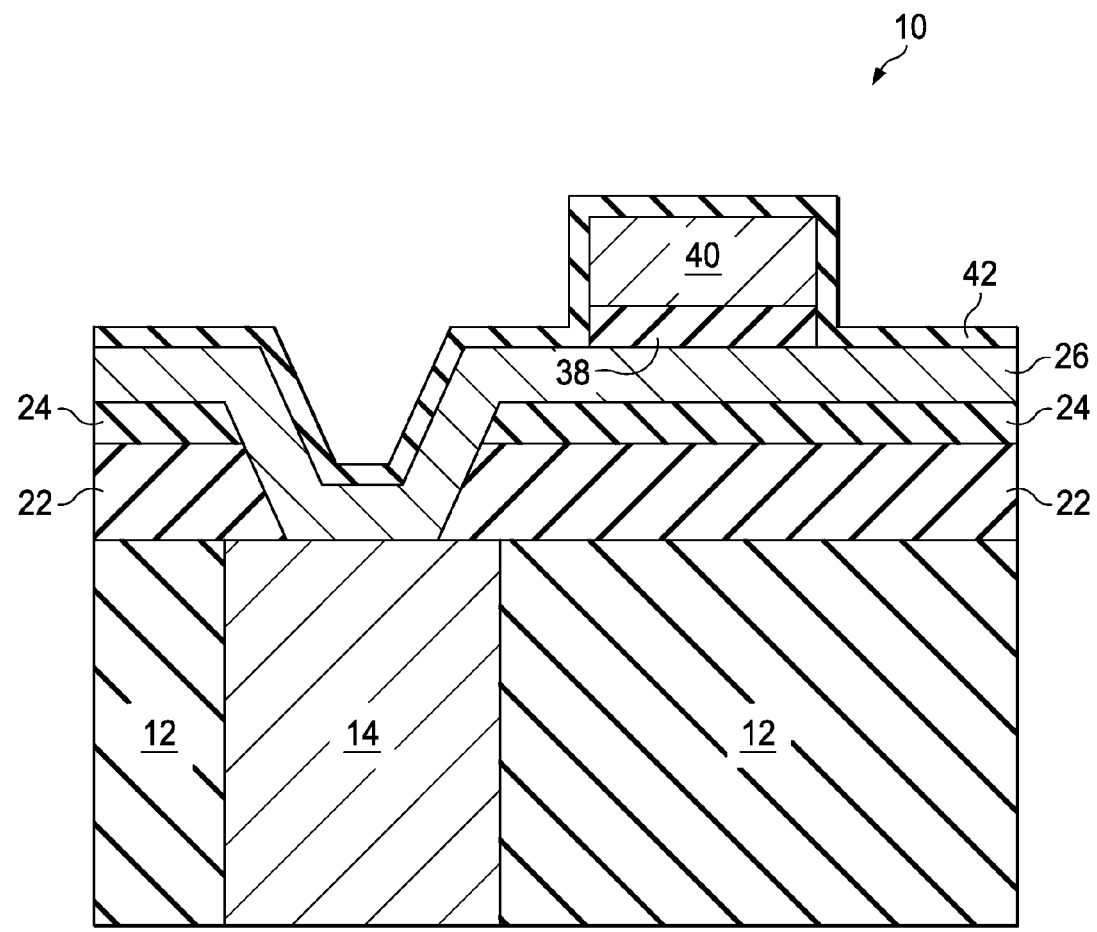

FIG. 5 also illustrates the formation of dielectric cap layer 42. Dielectric cap layer 42 extends on, and is in physical contact with, the sidewalls and the top surface of top metal 40, and is in physical contact with the sidewalls of MTJ stack 38. In an embodiment, dielectric cap layer 42 is formed of silicon nitride (SiN), although it may also be formed other dielectric materials. The forming method of dielectric cap layer 42 may include radical shower chemical vapor deposition (RSCVD) or other non-plasma generating CVD methods. The formation of dielectric cap layer 42 may be performed at a temperature lower than about 180° C., for example. The density of dielectric cap layer 42 is relatively low, and may be between about 2.3 g/cm$^3$ and about 2.4 g/cm$^3$. The thickness of dielectric cap layer 42 may be between about 30 Å and about 150 Å, for example.

The step of etching MTJ layers 28 for forming MTJ stack 38 and the step of forming dielectric cap layer 42 are in-situ formed in a same vacuum environment, with no vacuum break occurring between the step of etching MTJ layers 28 and the step of forming dielectric cap layer 42. The step of removing mask layer 32, which step is performed after the patterning of top metal layer 30 and MTJ layers 28, may also be performed in the same vacuum environment.

Figure 9:
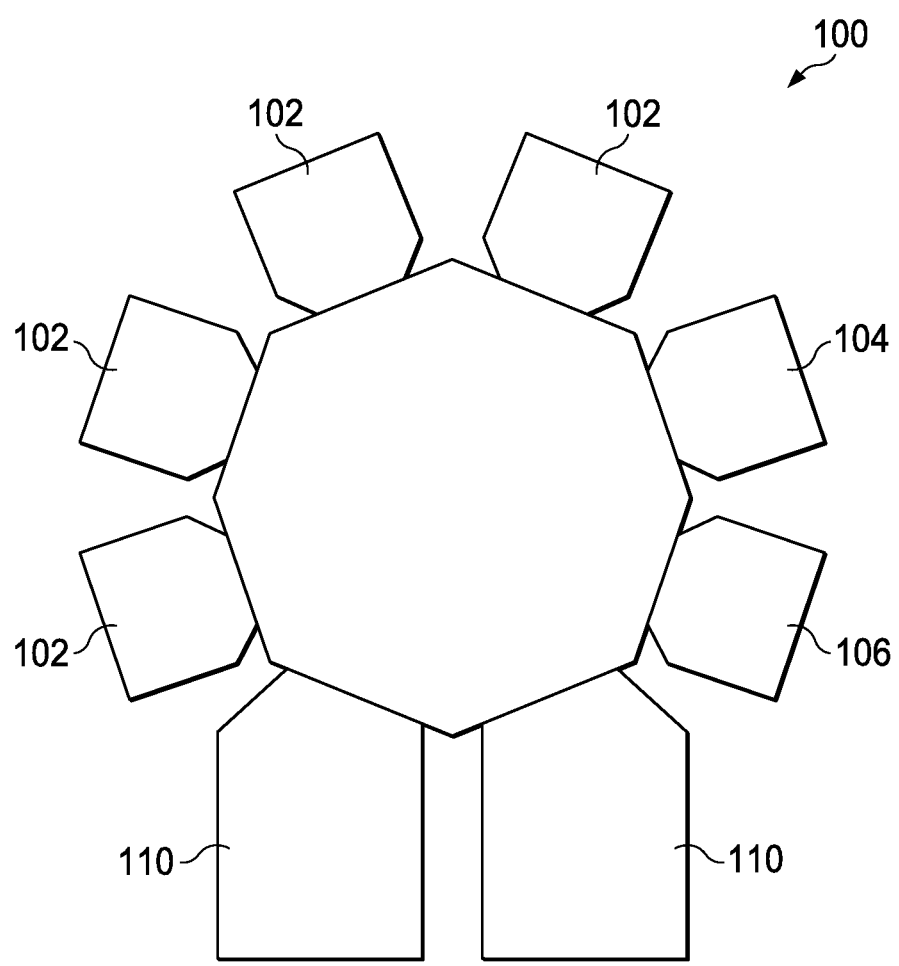
FIG. 9 illustrates a production tool for performing a patterning and a deposition step, wherein the patterning is used for forming the magnetic tunnel junction (MTJ) stack, and the deposition step is for forming a dielectric cap layer covering the MTJ stack.

FIG. 9 illustrates production tool 100 for performing the step of etching MTJ layers 28 for forming MTJ stack 38 and the step of forming dielectric cap layer 42. Production tool 100 includes loadlocks 110 for loading wafer 10 into production tool 100, and remove wafer 10 out of production tool 100. Production tool 100 further includes a plurality of etching chambers 102, which are used to etch different layers in top metal layer 30, MTJ layers 28, and mask layer 32. Chamber 104 is connected to, and shares the same vacuum environment as, etching chambers 102. Accordingly, no vacuum break occurs during, and between, the step of etching MTJ layers 28 and forming dielectric cap layer 42, and wafer 10 is not exposed to the external environment when transferred between chambers 102 and 104. Optionally, the step of etching metal layer 30 to form top metal 40 may also be in-situ performed in production tool 100. Accordingly, in the respective embodiment, there is no vacuum break starting from the step of etching metal layer 30 to after the step of forming dielectric cap layer 42 is finished.

Figure 6:
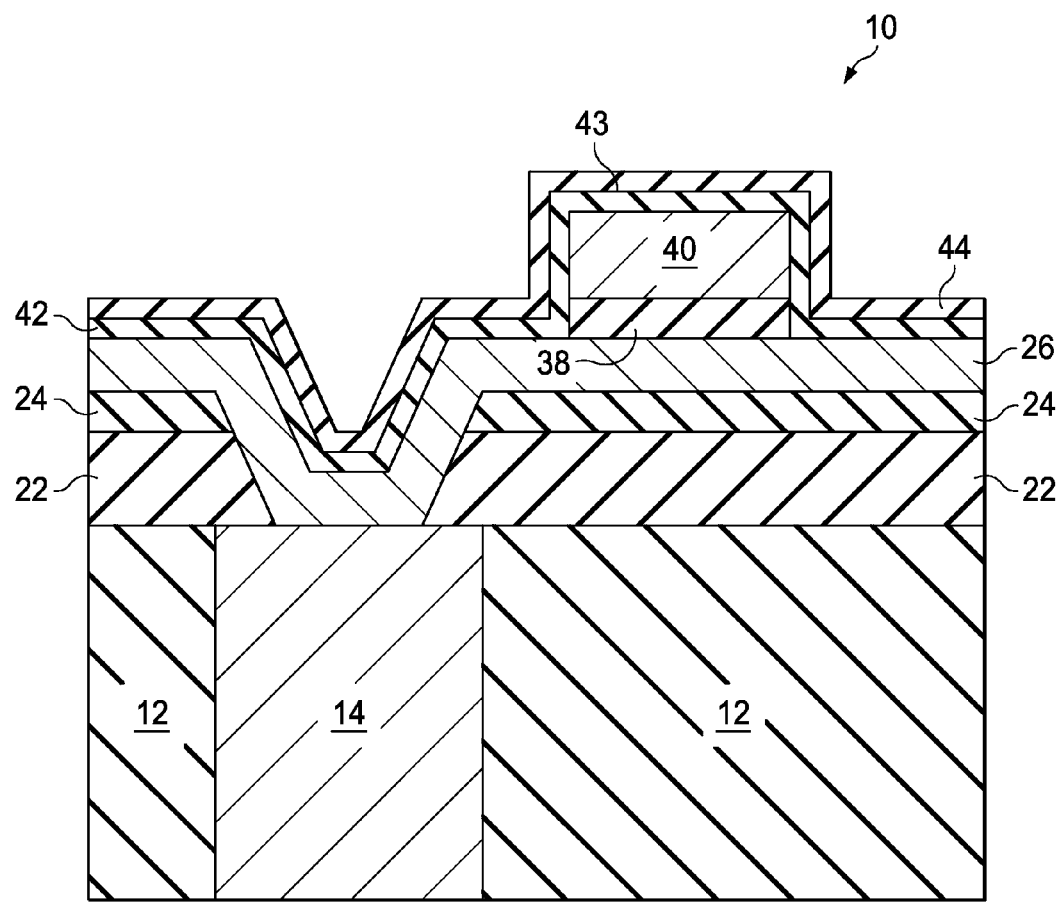

Next, as shown in FIG. 6, dielectric cap layer 44 is formed over dielectric cap layer 42. In an embodiment, dielectric cap layer 44 is formed of a same material, such as silicon nitride (SiN), as dielectric cap layer 42, although the materials of dielectric cap layers 42 and 44 may also be different from each other. The forming method of dielectric cap layer 42 may include plasma enhanced chemical vapor deposition (PECVD). Alternatively, other CVD methods that result in a high-quality and dense film may also be used, wherein the quality and the density of dielectric cap layer 44 are higher than that of dielectric cap layer 42. The density of dielectric cap layer 44 may be greater than about 2.6 g/cm$^3$, or between about 2.7 g/cm$^3$ and about 2.8 g/cm$^3$. In an embodiment, the density of dielectric cap layer 44 is higher than the density of dielectric cap layer 42 by greater than about 0.1 g/cm$^3$, or by greater than about 0.2 g/cm$^3$. Since dielectric cap layers 42 and 44 are formed separately, and are formed using different formation methods, there may be a visible interface 43 between dielectric cap layers 42 and 44, and dielectric cap layers 42 and 44 can be distinguished from each other even if they are formed of a same material. The thickness of dielectric cap layer 44 may be between about 100 Å and about 300 Å, for example.

In an embodiment, dielectric cap layer 44 is in-situ formed with the formation of dielectric cap layer 42, and may be formed in chamber 106 in production tool 100 (FIG. 9). Accordingly, there is no vacuum break between the formation of dielectric cap layer 42 and the formation of dielectric cap layer 44. In alternative embodiments, after the formation of dielectric cap layer 42, wafer 10 is removed out of production tool 100, and is sent to another chamber (not shown) for the formation of dielectric cap layer 44. Accordingly, there is a vacuum break between the formation of dielectric cap layer 42 and the formation of dielectric cap layer 44. During the transportation from production tool 100 to the chamber for forming dielectric cap layer 44, dielectric cap layer 42 protects MTJ stack 38 from degradation. In addition, during the formation of dielectric cap layer 44, dielectric cap layer 42 may also protect MTJ stack 38 from the damage of plasma if plasma is generated during the formation of dielectric cap layer 44.

Figure 7:
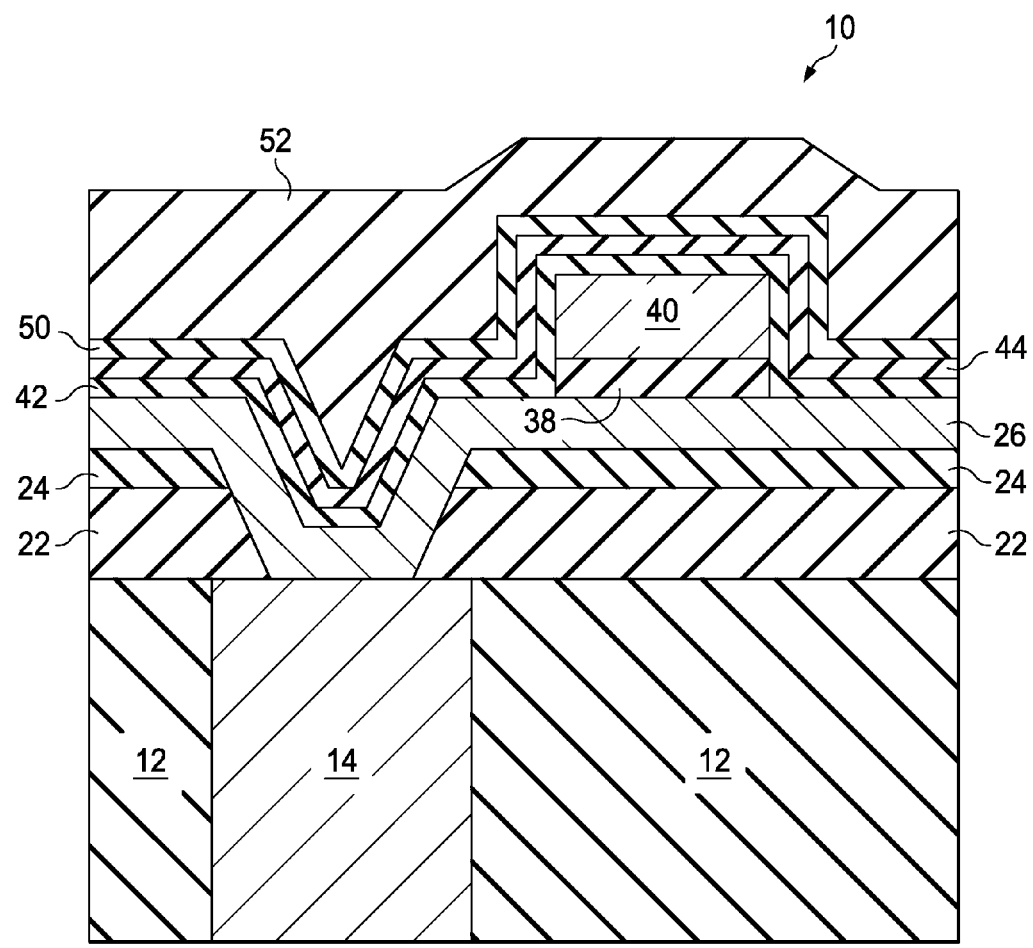
Figure 8:
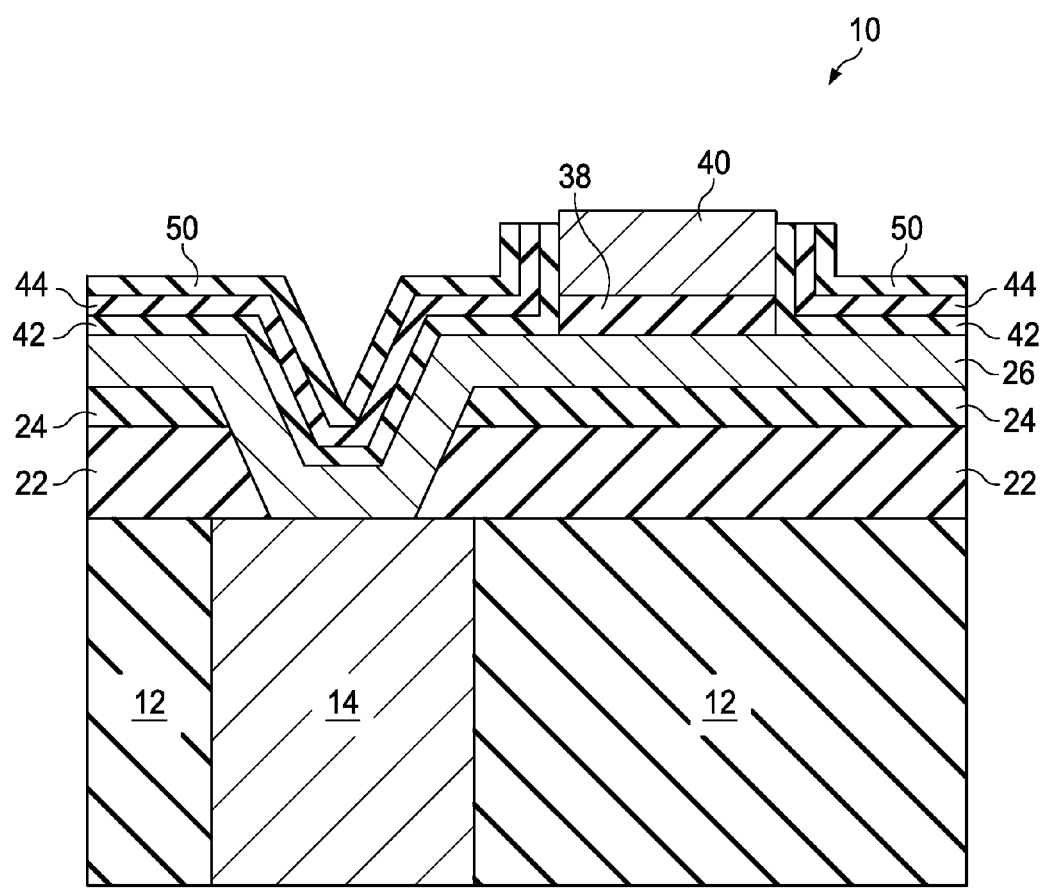

FIGS. 7 and 8 illustrate the formation of features that are over dielectric cap layer 44. Referring to FIG. 7, dielectric layer 50 is formed over, and may contact, dielectric cap layer 44. In an embodiment, dielectric layer 50 is an oxide layer, which may further be a silicon oxide layer. Next, BARC 52 is formed over dielectric layer 50, wherein BARC 52 may be formed of silicon oxynitride, for example.

As shown FIG. 8, an etch step is performed to etch the portions of BARC 52, dielectric layer 50, and dielectric cap layers 42 and 44, until top metal 40 is exposed. Dielectric cap layers 42 and 44 are patterned using a same mask, and may be treated as a single layer in subsequent processes. Next, BARC 52 is removed, while dielectric layer 50 and dielectric cap layers 42 and 44 may remain un-removed. In subsequent steps, additional layers such as a tantalum nitride layer (not shown) may be formed over, and possibly contacting, dielectric layer 50, top metal 40, and the top edge of dielectric cap layers 42 and 44.

In the embodiments, by forming dielectric cap layer 44 whose quality and density are improved over that of dielectric cap layer 42, MTJ stack 38 is well protected from moisture, oxygen, and the etching gas that are used in the subsequent process steps. Experiments were performed on the CoFeB/Mgo stacks that are formed on silicon substrates to find out the degradation rates of the CoFeB/Mgo stacks under room environments. A plurality of first samples of CoFeB/Mgo stacks was formed on silicon substrates, and each of the first samples was protected by a silicon nitride film formed using RSCVD, wherein the silicon nitride film has a thickness equal to about 260 Å. The vibrating sample magnetometer (VSM) data indicate that the three-day exposure of the first samples to the external environment resulted in 31.4 percent decay. As a comparison, a plurality of second samples of CoFeB/Mgo stacks was also made on silicon substrates, and each of the second samples was protected by a composite silicon nitride film. The composite silicon nitride film includes a first silicon nitride film formed using RSCVD and having a thickness equal to 50 Å, and a second silicon nitride film formed using PECVD and having a thickness equal to 210 Å. The vibrating sample magnetometer (VSM) data indicate that the three-day exposure of the second samples to the external environment result in 6.6 percent decay. Therefore, the experiment data revealed that significant better protection is provided by the composite silicon nitride film in accordance with embodiments.

In accordance with embodiments, a method includes patterning a plurality of magnetic tunnel junction (MTJ) layers to form a MTJ stack, and forming a first dielectric cap layer over a top surface and on a sidewall of the MTJ stack. The step of patterning and the step of forming the first dielectric cap layer are in-situ formed in a same vacuum environment. A second dielectric cap layer is formed over and contacting the first dielectric cap layer.

In accordance with other embodiments, a method includes patterning a plurality of MTJ layers to form a MTJ stack, and forming a first silicon nitride layer over a top surface and on a sidewall of the MTJ stack. The step of patterning and the step of forming the first silicon nitride layer are in-situ formed in a same vacuum environment, with no vacuum break occurring therebetween. A second silicon nitride layer is formed over and contacting the first dielectric cap layer, wherein the second silicon nitride layer has a higher density than the first silicon nitride layer.

In accordance with yet other embodiments, a device includes an MTJ stack, and a first dielectric cap layer in physical contact with a sidewall of the MTJ stack. A second dielectric cap layer is formed over and contacting a top surface and a sidewall of the first dielectric cap layer. The first and the second dielectric cap layers are formed of a same dielectric material, and wherein the second dielectric cap layer has a higher density than the first dielectric cap layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   patterning a plurality of magnetic tunnel junction (MTJ) layers to form a MTJ stack;
   forming a first dielectric cap layer over a top surface and on a sidewall of the MTJ stack, wherein the first dielectric cap layer is formed using radical shower chemical vapor deposition (RSCVD), wherein the step of patterning and the step of forming the first dielectric cap layer are in-situ formed in a same vacuum environment; and
   forming a second dielectric cap layer over and contacting the first dielectric cap layer, wherein the second dielectric cap layer is formed using plasma enhanced chemical vapor deposition (PECVD), wherein the first dielectric cap layer and the second dielectric cap layer are formed of a same dielectric material, and a first density of the first dielectric cap layer is different from a second density of the second dielectric cap layer.

2. The method of claim 1, wherein the first density of the first dielectric cap layer is lower than the second density of the second dielectric cap layer.

3. The method of claim 2, wherein the first and the second dielectric cap layers are silicon nitride layers.

4. The method of claim 1, wherein a vacuum break occurs between the steps of forming the first and second dielectric cap layers.

5. The method of claim 1, wherein no vacuum break occurs between the steps of forming the first and the second dielectric cap layers.

6. The method of claim 1 further comprising:
   forming a top metal over the MTJ stack, wherein the top metal is under the first and the second dielectric cap layers;
   forming a dielectric layer over and contacting the second dielectric cap layer; and
   etching the dielectric layer and the first and the second dielectric cap layers to expose the top metal.

7. A method comprising:
   patterning a plurality of magnetic tunnel junction (MTJ) layers to form a MTJ stack;
   forming a first silicon nitride layer over a top surface and on a sidewall of the MTJ stack using radical shower chemical vapor deposition (RSCVD), wherein the step of patterning and the step of forming the first silicon nitride layer are in-situ formed in a same vacuum environment, with no vacuum break occurring; and
   forming a second silicon nitride layer over and contacting the first silicon nitride layer using plasma enhanced chemical vapor deposition (PECVD), wherein the second silicon nitride layer has a higher density than the first silicon nitride layer.

8. The method of claim 7, wherein a vacuum break occurs between the steps of forming the first and the second silicon nitride layers.

9. The method of claim 7, wherein the step of forming the first silicon nitride layer is performed without generating plasma, and wherein the step of forming the second silicon nitride layer is performed with plasma generated.

10. The method of claim 7 further comprising:
    forming a top metal over the MTJ stack, wherein the top metal and the MTJ layers are patterned using a same mask, and wherein the top metal is under the first and the second silicon nitride layers;
    forming an oxide layer over and contacting the second silicon nitride layer; and
    etching the oxide layer and the first and the second silicon nitride layers to expose the top metal.

11. The method of claim 7, wherein the first silicon nitride layer contacts the sidewall of the MTJ stack.

12. The method of claim 7, wherein the MTJ stack comprises a pinning layer, a pinned layer adjoining the pinning layer, a tunnel layer adjoining the pinned layer, and a free layer adjoining the tunnel layer.

13. A method comprising:
    patterning a plurality of magnetic tunnel junction (MTJ) layers to form a MTJ stack;
    forming a first dielectric cap layer over a top surface and on a sidewall of the MTJ stack using radical shower chemical vapor deposition (RSCVD), wherein the patterning and the forming the first dielectric cap layer are in-situ formed in a same vacuum environment;
    forming a second dielectric cap layer over and contacting the first dielectric cap layer using plasma enhanced chemical vapor deposition (PECVD);
    forming a top metal over the MTJ stack, wherein the top metal and the MTJ layers are patterned using a same mask, and wherein the top metal is under the first and the second dielectric cap layers;
    forming an oxide layer over and contacting the second dielectric cap layer; and
    etching the oxide layer and the first and the second dielectric cap layers to expose the top metal.

14. The method of claim 13, wherein the second dielectric cap layer has a second density higher than a first density of the first dielectric cap layer, and wherein the first dielectric cap layer and the second dielectric cap layer are formed of a same dielectric material.

15. The method of claim 14, wherein a difference between the second density and the first density is greater than about 0.1 g/cm$^3$.

16. The method of claim 13, wherein the first dielectric cap layer is in contact with sidewalls of the MTJ stack.

17. The method of claim 13, wherein the MTJ stack comprises a pinning layer, a pinned layer adjoining the pinning layer, a tunnel layer adjoining the pinned layer, and a free layer adjoining the tunnel layer.

18. The method of claim 13, wherein the forming the first dielectric cap layer and the forming the second dielectric layer comprise depositing a first silicon nitride layer and a second silicon nitride layer, respectively.

\* \* \* \* \*